(12) United States Patent
Celauro

(10) Patent No.: US 6,855,882 B2
(45) Date of Patent: Feb. 15, 2005

(54) CASCADED INERT GAS PURGING SYSTEM

(75) Inventor: Paul J. Celauro, Free Bridges, NJ (US)

(73) Assignee: The BOC Group, Inc., Murray Hill, NJ (US)

( * ) Notice: Subject to any disclaimer, the term of this patent is extended or adjusted under 35 U.S.C. 154(b) by 0 days.

(21) Appl. No.: 10/253,968

(22) Filed: Sep. 24, 2002

(65) Prior Publication Data

US 2003/0066668 A1 Apr. 10, 2003

Related U.S. Application Data

(63) Continuation-in-part of application No. 09/710,271, filed on Nov. 10, 2000, now Pat. No. 6,459,036.

(51) Int. Cl.[7] .................................................. H05K 5/00
(52) U.S. Cl. ............................. 174/17 GF; 174/17 VA
(58) Field of Search ...................... 174/17 GF, 17 VA, 174/50, 11 R; 220/4.02

(56) References Cited

U.S. PATENT DOCUMENTS

| 5,101,710 | A | * | 4/1992 | Baucom | 454/238 |
| 5,603,892 | A | * | 2/1997 | Grilletto et al. | 422/3 |
| 5,888,401 | A | * | 3/1999 | Nguyen | 210/650 |
| 6,075,204 | A | * | 6/2000 | Celauro et al. | 174/17 GF |
| 6,459,036 | B1 | * | 10/2002 | Celauro | 174/17 GF |

* cited by examiner

Primary Examiner—Dhiru R. Patel
(74) Attorney, Agent, or Firm—Joshua L. Cohen

(57) ABSTRACT

The present invention is a system for protecting, for example, electronic, mechanical, or other components from contamination in a processing environment and includes a distribution manifold, a pressurized fluid in fluid communication with the manifold, and a plurality of apparatuses, such as sensors, which are connected to the manifold by respective conduits throughwhich the pressurized fluid flows to maintain a positive pressure at each of the apparatuses to prevent the processing environment from contacting the plurality of apparatus.

14 Claims, 5 Drawing Sheets

FIG. 2

CASCADED INERT GAS PURGING SYSTEM

CROSS-REFERENCE TO RELATED APPLICATION

This is a continuation-in-part of application Ser. No. 09/710,271 filed Nov. 10, 2000 now U.S. Pat. No. 6,459,036.

BACKGROUND OF THE INVENTION

The present invention relates to systems used for protecting electronic, mechanical, hydraulic or other components from the effects of harsh environments that may exist in industrial facilities.

The importance of controlling and monitoring production processes using for example, electronic, mechanical, electromechanical, hydraulic devices and instrumentation requires that, at times, the electronic instrumentation be located in the production environment. This places the electronic instrumentation in surroundings that may be harsh and can often have a detrimental effect on the electronic components that such components may not be capable of withstanding. For example, electronic devices may be placed in a plant process environment that normally sustains saturation humidity that, over time, can severely damage and incapacitate the electronic components, if not properly protected.

Another problem occurs during plant cleaning or disinfection, which may require that the plant equipment used be cleaned with high pressure hot water. Water pressures greater than 600 psi may be used to plant clean equipment. Such cleaning can be detrimental to the electronic monitoring and control systems situated nearby. Such water pressures can easily penetrate most common rated electronic enclosures resulting in damage to the electronic circuitry contained within.

To overcome the problem, electronic components have been placed in hermetically sealed chambers that are designed to be waterproof. This technique is described in U.S. Pat. No. 6,075,204 to Celauro et al. This waterproof enclosure has proven successful under severely harsh conditions by preventing condensation from forming inside the enclosure as the outside temperature decreases, thereby eliminating damage to the electronics within. However, this system does not make a direct provision for the hermetically isolated satellite sensors connected to the system. Thus, the sensors are still subjected to the same harsh environment, unless the sensors are independently purged with a dry gas.

U.S. Pat. No. 5,603,892 to Grilletto et al. provides a gas purged electronics enclosure in which a control system is used to open and close valves to purge a contaminant-free gas through the electronics enclosure. In addition, a getter material is used as a scavenger to ensure the removal of contaminants. This patent describes a system that has only one enclosure for housing electronic components.

While purge systems are known, the prior art does not provide a suitable and economical solution for protecting electronic and other devices that may be located in various places throughout a process environment and which may be interconnected. What is needed is an integrated system that is capable of protecting these multiple interconnected devices.

SUMMARY OF THE INVENTION

The present invention provides a system that protects electronic and other components from the outside environment by means of continuously cascading a flowing pressurized gas through the system to prevent harsh environmental conditions from adversely effecting system components' and the components ability to monitor a plurality of plant operations.

The present invention is an integral cascaded distributed purge system used to protect interconnected electronic components, although the system is not limited to such electronic components. The system is particularly useful in industrial applications where the surrounding environment can adversely affect electronic components. For example, in a food plant, cleaning procedures require that hot water, strong caustic detergents and steam be used to wash down equipment. This creates an atmosphere where moisture can inadvertently enter into a sealed enclosure, ultimately leading to electronic failures. By installing the distributed purge gas system of the present invention, electronic devices located at different points in a process are protected by an integrated system that continuously purges pressurized gas through the system. This is accomplished in an efficient and cost effective manner, i.e. through already existing interconnecting cabling and fixtures.

The system is capable of providing protection to the entire system of separately housed electronic devices from a single highly reliable source.

Accordingly, the present invention is a system for protecting electronic or other components from contamination, which includes a tightly controlled, multi-tiered distribution means; a pressurized gas in fluid communication with the distribution means; a plurality of apparatus for enclosing electronic devices connected to the distribution means, with each apparatus connected to the distribution means by a conduit having a first end and a second end, wherein the first end is connected to the distribution means and the second end is connected to the apparatus.

The present invention also includes:

i) A system for protecting a data component from contamination, comprising: sensing means constructed and arranged for communication with a process component to be sensed and for transmitting a signal representing the sensed process component; distribution means for distributing a pressurized fluid to the sensing means; connecting means for connecting said distribution means with said sensing means and having a first end and a second end, said first end being connected to said distribution means for communication therewith, and said second end being connected to said sensing means for communication therewith; and regulating means in communication with said sensing means for regulating the fluid pressure from said distribution means to be greater at the sensing means than a pressure of the environment external to said system.

ii) A method for protecting a data component from contamination in a processing environment, comprising enclosing the data component in an enclosure; supplying pressurized fluid to said enclosure; maintaining a positive pressure of said pressurized fluid; and venting said pressurized fluid as necessary to maintain the positive pressure selected.

iii) A method for protecting data components in a processing environment, comprising: providing a pressure differential between the data components and the processing environment; controlling the pressure differential for a pressure at the data components to exceed a pressure at the processing environment for preventing the processing environment from contacting the data components; and regulating the pressure differential between the data components and the processing environment to remain continuous at a select pressure.

iv) A method for protecting a data component from an external environment, comprising: providing a fluid with a first pressure at the data component; enclosing the fluid at the data component; maintaining the first pressure of the fluid at the data component for providing a fluid wall at the data component; separating the data component from the external environment with the fluid wall; and venting the fluid pressure of the fluid to maintain the fluid wall at a select pressure.

BRIEF DESCRIPTION OF THE DRAWINGS

For a more complete understanding of the present invention, reference may be had to the detailed description of the preferred embodiments taken in conjunction with drawings, of which.

DETAILED DESCRIPTION OF THE PREFERRED EMBODIMENTS

The present invention prevents moisture and contaminants from the surrounding process environment from contacting for example, electronic or mechanical components, or data gathering devices situated in the environment. The term "contaminants" as used herein means moisture, particulate matter or any other substance which may adversely impact the components and their operation.

Figure 1:
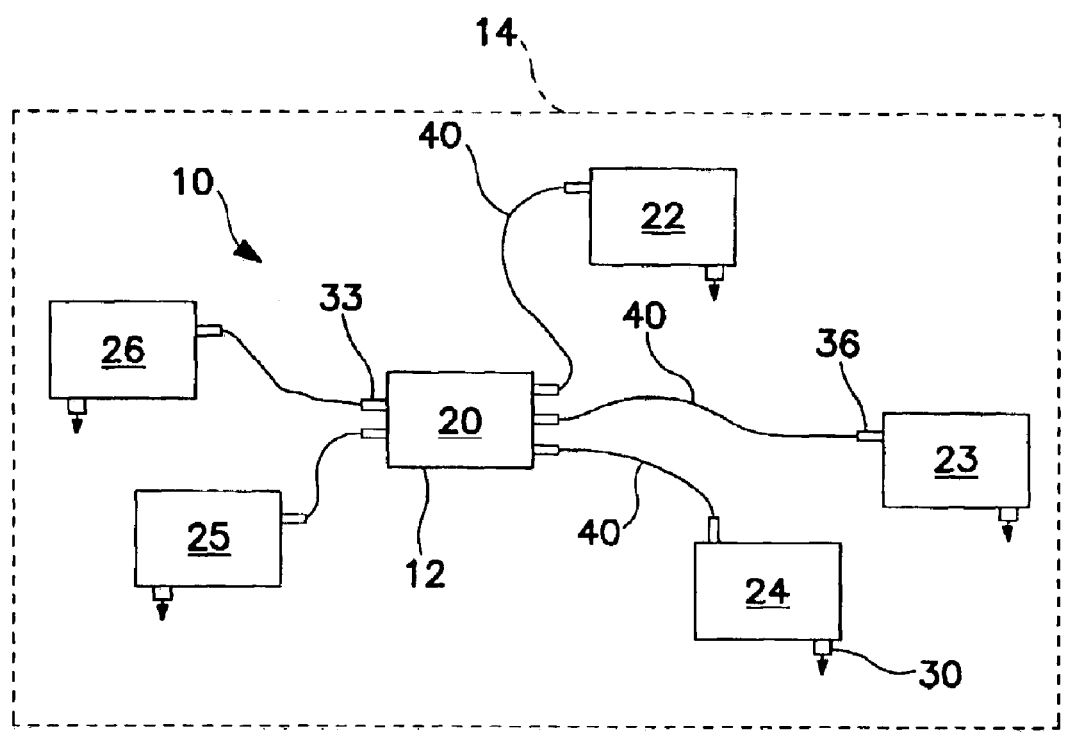
FIG. 1 is a schematic representation of a preferred embodiment of a distribution purge system of the present invention.

In FIG. 1, electronic components are protected in a distributed or cascaded purge gas system of the present invention shown generally at 10, where pressurized gas is directed to flow from 12 into a distribution means such as distribution manifold 20. The manifold 20 distributes the pressurized gas through a conduit, such as cable or conduit 40, to apparatuses 22, 23, 24, 25 and 26 ("22–26"), which house the electronic or mechanical components at different locations along the process. The components are constructed to generate signals representing data sensed at locations in a plant or processing environment. The manifold includes electric components (not shown) for the system. These components are constructed and arranged as transceivers, i.e. to receive sensor signals from the apparatus 22–26 via the conduit 40 and in turn generate a data signal to another remote location reporting on the production environment being sensed and monitored.

Alternatively, each of the apparatus 22–26 can be used for different sensory functions, i.e., the sensing of temperature, pressure, humidity, flow, level, noise, etc. of other devices or systems being monitored or controlled by the system 10. Each manifold 20 in combination with the apparatus 22–26 are referred to herein as a hub network 14. A hub network 14 preferably includes one manifold 20, at least one of the apparatus 22–26 and the conduit 40 connecting the manifold and apparatus selected. However, for most processing environments, a plurality of apparatus will be connected to the manifold 20. See for example, FIG. 2. The system 10 may include a plurality of the hub networks 14 for a single plant facility. Where a plurality of hub networks 14 are used, the manifolds 20 will be preferably arranged in parallel.

Each apparatus 22–26 is designed with a pressure or flow control means such as check valve 30. The valve 30 allows the manifold 20 and therefore the system 10 to purge pressurized gas through each apparatus serially or in parallel by continuously (if necessary) venting or bleeding a portion of the pressurized gas through the check valve to maintain the system 10 at a desired pressure. The valve 30 is set to open and release the pressurized gas at a predetermined pressure. The check valve 30 continuously controls the pressurized gas at a preferred pressure to be about 1 to 2 psi above the next level in the flow cascade and at the least, to maintain a pressure within the system 10 above that of the plant environment so that moisture, for example, is prevented from entering the apparatus 22–26 in the system 10. In effect, a pressurized wall of a fluid, preferably a gas, is used and controlled to prevent ingress of the external environment into the system 10. In the case of the last apparatus in the flow cascade (exhaust to atmosphere), the check valve 30 will typically hold the internal pressure of the final apparatus at about 0.5 to 1 psi above the surrounding external environment.

Figure 2:
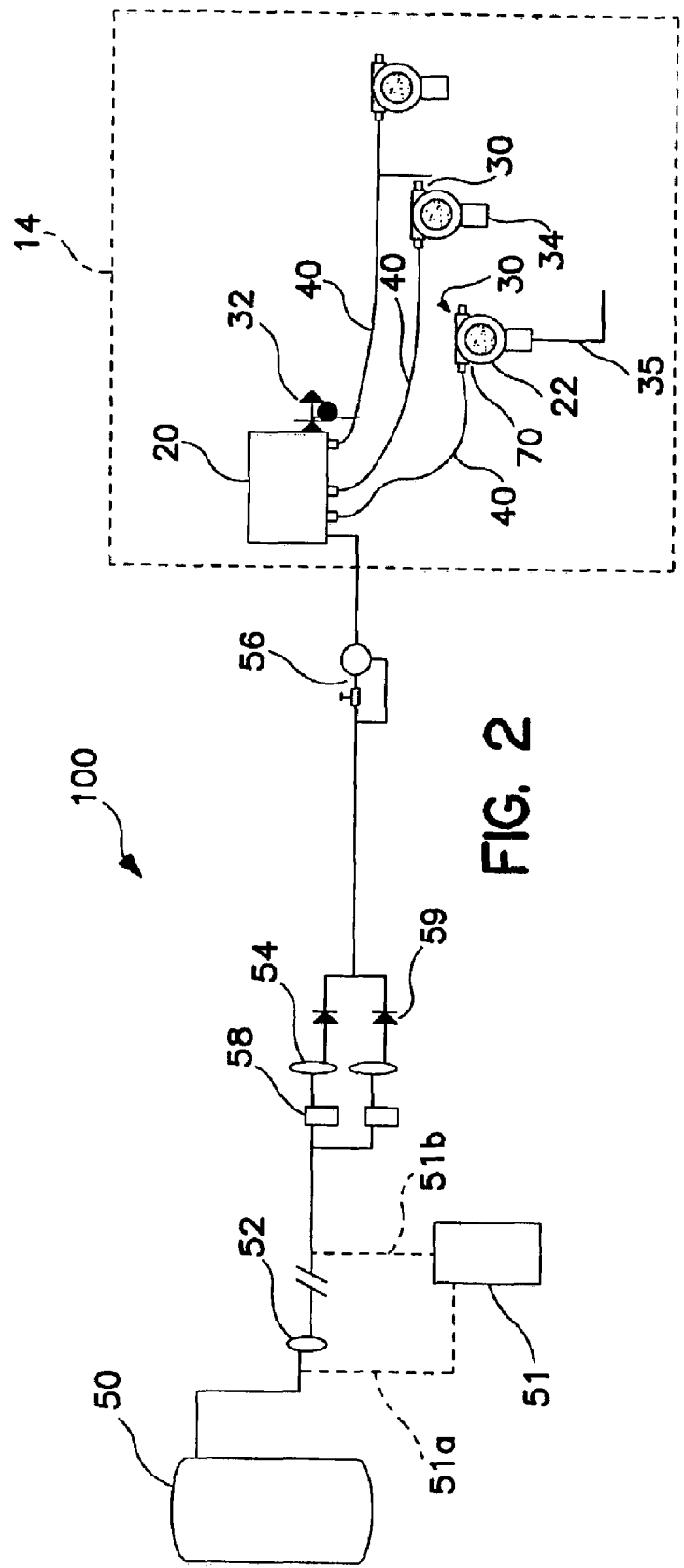
FIG. 2 is a schematic representation of another embodiment of a distributed purge system of the present invention.

FIG. 2 represents another embodiment of a distributed purge system of the present invention shown generally at 100. Pressurized gas is supplied from supply tank 50 and directed to filter 58 for removal of contaminants and moisture. The pressure of the pressurized gas is decreased through a series of pressure regulating valves 52 and 54. By way of example, pressurized gas from the supply tank 50 may be at about 45 psi. The pressure is reduced to 35 psi by pressure regulating valve 52 and then reduced further to 30 psi by pressure regulating valve 54.

The supply tank 50 may contain liquid nitrogen (LN) for use with the system 100. Alternatively, a supply tank 51 contains compressed dry air, which air can be sourced from the immediate facility in which the system 100 is operating. A solid state membrane air dryer can be used which provides (−)40° F. dewpoint air; which is a very dry air.

The compressed dry air can be introduced from the tank 51 to the system 100 through either line 51a or 51b. The selection of line 51a or 51b will be determined by whether or not the compressed dry air is to be introduced upstream or downstream of the pressure regulating valve 52. Regardless of which of the lines 51a, 51b is used, it is preferred to introduce the compressed dry air from the tank 51 upstream of the filter 58 to take advantage of filtering the air to be introduced into the system 100.

Differential flow control module 56 modulates the pressure of its effluent pressurized gas to control the flow of the pressurized gas into the distribution manifold 20. For example, pressurized gas at about 30 psi may be continuously modulated at about 2 psi at the effluent of the flow control module 56. The pressurized gas 12 is shown flowing continuously through conduit 40 into the apparatuses 22–26, such as for example, apparatus 22, and being exhausted through check valve 30, which is shown in greater detail in FIG. 3.

The apparatuses 22–26 are shown with sensing means 34, which is a part of the respective one of the apparatus 22–26.

The sensing means 34 can optionally be constructed and arranged within each apparatus. The sensing means is in communication with a process, system or apparatus (not shown) of the host facility by connector 35. Where a plurality of the hub networks 14 are used, the sensing means 34 are preferably arranged in series.

The control module 56 is provided for each manifold 20 and preferably for each hub network 14. The module 56 preferably includes a needle valve and a constant differential relay.

Integration of more than one apparatus 22–26 to a distribution manifold 20 increases the efficiency and cost effectiveness of the systems 10,100. The carefully controlled pressurized gas-sharing arrangement minimizes the number of separate pressurized gas supply sources that are needed by doing away with the closed system arrangement used in the prior art, where each electronic device is housed in its own system, thereby greatly increasing complexity and material costs. The system 10,100 of the present invention easily and capably maintains pressure in the system by controlling, via cascade, the flow of the pressurized gas through a multitude of apparatuses 22–26 that house electronic devices in the system by utilizing "cracking" or relief pressures of the check valves 30 installed in each apparatus to apportion the flow.

While the system 100 in FIG. 2 depicts a single distribution means, it should be understood that the present invention can be readily configured with an infinite number of hub networks 14, such as shown in FIG. 1, without compromising the effectiveness or efficiency of the system.

While apparatuses 22–26 are shown in FIG. 1, it should be understood that the present invention will provide protection for one or a plurality of cascaded levels of purged enclosures. This protection is achieved from the present system also utilizing the existing cascaded electrical connectivity of the distributed electronics system to distribute the purge gas.

The distribution means may be any suitable device that is capable of distributing pressurized gas 12 to each apparatus 22–26, which house an electronic device. The apparatus 22–26 however, may each alternatively be connected to or in communication with an electronic device, rather than actually house the electronic device. In such an arrangement, the cascade effect of maintaining pressure is still employed to protect the system 10, 100.

Preferably, the distribution manifold 20 is hermetically sealed to reduce the possibility of contaminants from entering the system 10,100 and to maintain a positive pressure within the system. It should be noted that the hermetic seal by itself may not be sufficient in preventing moisture, i.e. steam or condensate, or other contaminants from entering or forming in the distribution manifold 20. By continuously purging the system with pressurized gas, the gas in the system is constantly changing, thus decreasing the chance of moisture or contaminant collection and formation. A pressure control device, such as check valve 32 shown in FIG. 2, may be connected to the distribution manifold 20 to assist in adjusting the pressure of gas in the manifold 20. Non-limiting examples of the distribution manifold 20 include boxes, enclosures, electrical panels, manifolds, pipes, tubes, electrical cables and conduits, and intermediate storage canisters or tanks.

Preferably, pressurized gas 12 can be any inert gas source. For the purposes of the present invention, the term "inert gases" is intended to mean any gas that will not react with, and in the environment created within, the apparatus or system. For example, nitrogen, helium, compressed dry air or instrumentation air of relatively high purity with minimal moisture content, are some of the many inert gases that may be used with the system 10,100 of the present invention. Preferably, the pressurized gas is superdried compressed air having a dewpoint of about −40° F.

Figure 3:
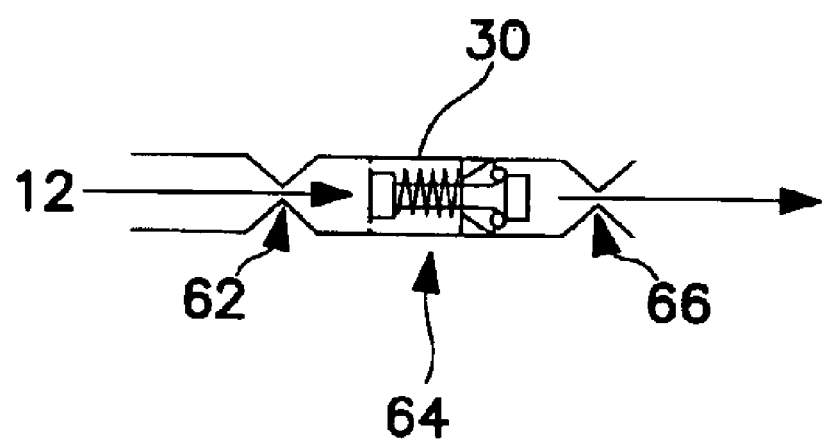
FIG. 3 is a schematic representation of a check valve that functions as a flow control means in a preferred embodiment of the present invention.

A flow control check valve 30 shown in FIG. 3 is an example of a device that is capable of providing flow control by modulating pressure from upstream in the system. Pressurized gas 12 flows into the flow control valve 30 from the electronics or other enclosure, first passing through fixed restriction zone 62, then into the variable restriction zone 64. The variable restriction zone 64 is shown as a spring mechanism, which opens the check valve when the pressure exceeds a predetermined value. The pressurized gas then passes through a second fixed restriction zone 66 for exiting the flow control valve 30. However, a device that can control the flow of a pressurized gas may be used. Particularly preferred is a ball and spring type valve device, or diaphragm actuated check valve. The flow control check valve 30 may be located at an exterior surface of each of the apparatus 22–26 for allowing gas to continuously exit the respective apparatus 22–26 and hence, the system 10, 100.

Figure 4:
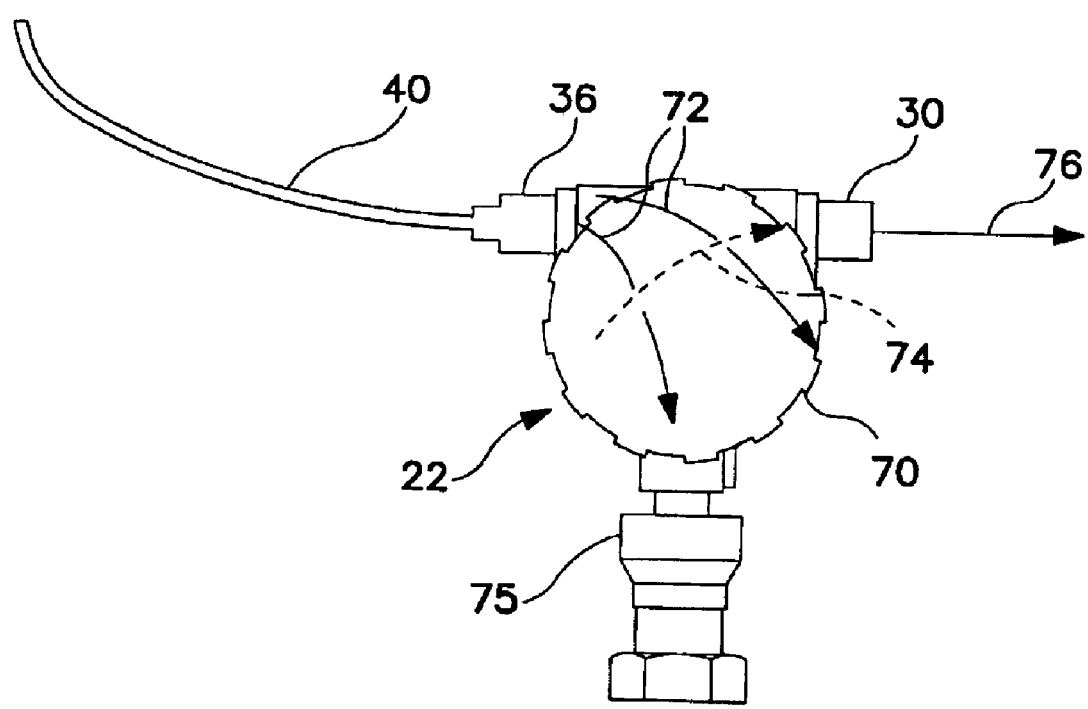
FIG. 4 is a schematic representation of an apparatus for enclosing, for example, devices to be sensed or sensing devices according to the present invention.

Referring again to FIGS. 1 and 2, the system 10,100 of the present invention may have a plurality of manifolds 20 for housing electronic components from the outside environment. The manifold for enclosing the electronic components preferably includes: an enclosure preferably formed of a continuous sidewall having an opening at one end thereof to provide access to an interior of manifold 20 in the interior of the enclosure. Electronic components are disposed at an interior of the enclosure, which interior is in a fluid communication with the conduit 40 and also provided with the check valve 32. At a preferred embodiment, the access opening for the enclosure is provided with a substantially tamper proof cover for the opening to prevent access to the internal components and contamination thereof. Complete replacement or turnover of all gas within the entire system occurs three to ten times per hour for optimum protection of the system The apparatus shown in FIG. 4 shows an example of an apparatus 22 for enclosing or communicating with the electronic or mechanical devices in the plant. Pressurized gas 72 is distributed to apparatus 22 via cable 40, which is connected to apparatus 22 by receptacle 36. Pressurized gas 72 circulates within a housing 70 of the apparatus 22. Upon reaching the predetermined pressure, pressurized gas 74 exits housing 70 through flow control check valve 30 and exhausts to the atmosphere 76. The apparatus 22–26 may include its own integral sensor 75 or such sensor 75 may be disposed at a remote location and connected to the apparatus 22 by another cable or conduit similar to that of conduit 40. A flow control check valve 30 may also be used with the sensor 75 disposed at the remote location.

Figure 5:
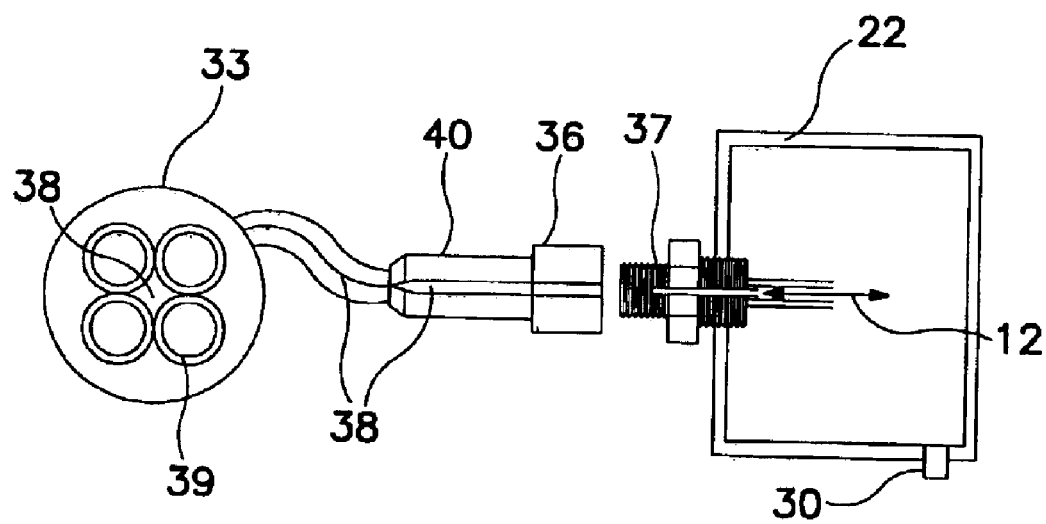
FIG. 5 is a schematic representation of gas flow elements of the system of the present invention.

As also shown in FIG. 5, the pressurized gas flows through conduit 40 into their respective apparatus 22–26. Each apparatus is connected to the distribution means or manifold 20 via its own conduit 40. The conduit 40 used for this purpose must be capable of handling pressurized gas flow. Generally, the conduit 40 will additionally be used to contain electrical cables and wires. For example, any form of tubing may be used, such as pipes, plastics, cables, or the like, which are suitable conduits. Preferably, each conduit 40 has a first end such as receptacle 33 that is connected to the manifold 20 and a second end such as receptacle 36 that connects to the respective one of the apparatus 22–26 at a mating receptacle 37. The receptacles 33, 36, 37 are preferably impervious to water and do not allow the gas to escape the system. A passageway 38 extends through the conduit 40 preferably between contact pins 39 of the receptacle 33.

Figure 5A:
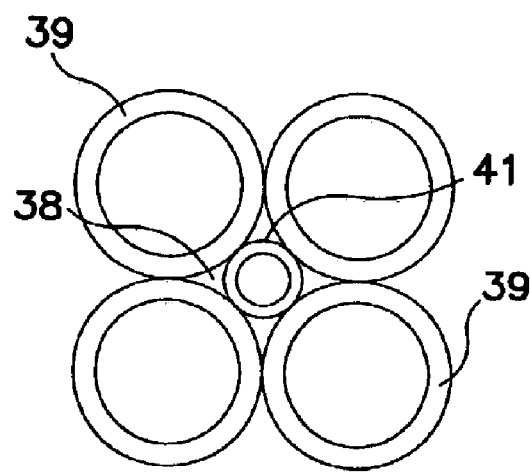
FIG. 5A shows an alternate arrangement for certain features of FIG. 5.

In another embodiment of the conduit 40 as shown in FIG. 5A, a tube 41 extends through the passageway 38 or core of the conduit. The tube 41 provides passage for the pressurized gas between and among the elements of the system. In a preferred embodiment of the present invention, modified part P/N FS 4.4-0.5/14.5 microstyle DC receptacles available from Turck, Inc. are used. In the preferred embodiment, the receptacles are multi-pin male connectors, which are mated to molded female connectors having shielded or jacketed cables for connection of the electronic circuitry internal to the enclosure to a central computer or other external electronics.

Should a conduit 40 leak or be severed, such condition will not diminish or compromise the effectiveness of the system 10, 100. The pressure of the system will be compensated for by the valve 32 at manifold 20 closing off to maintain pressure. In such a situation, the slight reduction in pressure will trigger an alarm in the system for appropriate corrective action to be taken.

Referring again to FIGS. 2, 3, and 5A, flow and pressure profiles for the present system 10, 100 can be realized by the construction, control and disposition of the system in the corresponding facility or plant. In particular, pressure control points are preferably realized at regulating valves 52 and 54, as well as check valve 32 and variable restriction zone 64. Flow control points for the present system 10, 100 are realized at flow control module 56 and fixed restriction zones 62, 66. In addition, the conduit 40 is also provided with flow control points by virtue of the tube 41 as discussed with respect to FIG. 5A. The flow and pressure profiles provide for a steady, continuous flow of the pressurizing fluid through the components at each level of the cascade in the system 10, 100.

Although the system of the present invention is typically used in wet, humid environments, it should be understood that the system may be used in any environment, wherein it is desirable to prevent moisture and contaminants from contacting an electronic, mechanical, etc., apparatus.

The present invention has been described with particular reference to the preferred embodiments thereof. It will be understood that variations and modifications may be made therein without departing from the spirit and scope of the present invention as defined in the appended claims.

What is claimed is:

1. A system for protecting a data component from contamination in a processing environment external to the system, comprising:
    sensing moans constructed and arranged for communication with a process component to be sensed in the processing environment and for transmitting a signal representing the sensed process component;
    distribution means for distributing a fluid under pressure to the sensing means;
    connecting means for connecting said distribution means with said sensing means and having a first end and a second and, said first end being connected to said distribution means for communication therewith, and said second end being connected to said sensing means for communication therewith for distribution of the pressurized fluid; and
    regulating means in communication with said sensing means for regulating the fluid pressure distributed from said distribution means to be greater at the sensing means than a pressure of the environment external to said system at said sensing means.

2. The system according to claim 1, wherein the sensing means, comprises:
    a housing for the data component, said data component being adapted to coact with the process component to be sensed.

3. The system according to claim 1, wherein said fluid is a gas selected from the group consisting of nitrogen, compressed air, superdried compressed air, instrumentation air, and mixtures of said gases from the group.

4. The system according to claim 1, further comprising a filter in communication with said distribution means to remove impurities and moisture from the system.

5. The system according to claim 1, wherein said distribution means comprises a manifold.

6. The system according to claim 1, wherein the fluid is under continuous pressure.

7. The system according to claim 1, wherein the distribution means, comprises:
    a manifold adapted to maintain the fluid pressure at a level greater than a pressure external to the system; and
    transceiver means adapted for receiving said signal from the sensing means and transmitting a related signal to a remote location.

8. The system according to claim 1, wherein the distribution means comprises a sidewall constructed and arranged to be in communication with a plurality of the connecting means.

9. The system according to claim 1, wherein the connecting means comprises a conduit containing the pressurized fluid.

10. The system according to claim 9, further comprising a tube disposed in the conduit for containing the pressurized fluid.

11. The system according to claim 1, wherein the regulating means comprises a check value.

12. A method for protecting data components in a processing environment, comprising:
    providing a pressure differential between the data components and the processing environment;
    controlling the pressure differential for a pressure at the data components to exceed a pressure at the processing environment for preventing the data components from being exposed to the processing environment; and
    regulating the pressure differential between the data components and the processing environment to remain continuous at a select pressure differential.

13. The method according to claim 12, wherein regulating further comprises venting the pressure at the data components for maintaining the pressure differential selected.

14. A system according to claim 1, wherein the connecting means comprises cabling existing in the processing environment.

* * * * *